United States Patent [19]

Rose et al.

[11] Patent Number: 4,980,558

[45] Date of Patent: Dec. 25, 1990

[54] ELECTRON BEAM GENERATOR

[75] Inventors: Harald Rose, Darmstadt; Gerald Schoenecker, Ruesselscheim, both of Fed. Rep. of Germany

[73] Assignee: Siemens Aktiengesellschaft, Berlin and Munich, Fed. Rep. of Germany

[21] Appl. No.: 379,270

[22] Filed: Jul. 13, 1989

[30] Foreign Application Priority Data

Sep. 20, 1988 [DE] Fed. Rep. of Germany ....... 3831940

[51] Int. Cl.$^5$ ............................................. H01J 29/46
[52] U.S. Cl. ................. 250/423 R; 313/336; 313/421; 313/422; 313/423
[58] Field of Search ..................... 250/423 R; 313/422, 313/421, 423, 336

[56] References Cited

U.S. PATENT DOCUMENTS

| | | | |
|---|---|---|---|
| 2,916,668 | 12/1959 | Dyke et al. | 313/336 |
| 3,374,386 | 3/1968 | Charbonnier et al. | 313/336 |
| 4,182,958 | 1/1980 | Goto et al. | 250/398 |
| 4,213,053 | 7/1980 | Pfeiffer | 250/398 |
| 4,551,599 | 11/1985 | Liebl | 250/398 |
| 4,658,188 | 4/1987 | Bohmer | 313/422 |
| 4,724,328 | 2/1988 | Lischke | 250/492.2 |
| 4,731,537 | 3/1988 | Williams et al. | 250/398 |
| 4,804,851 | 2/1989 | Nixon | 250/398 |
| 4,804,887 | 2/1989 | Miyama et al. | 313/422 |
| 4,816,724 | 3/1989 | Hamada et al. | 313/422 |
| 4,853,587 | 8/1989 | Lamport et al. | 313/422 |

FOREIGN PATENT DOCUMENTS 0191439 2/1986 European Pat. Off. .

Primary Examiner—Jack I. Berman
Assistant Examiner—Kiet T. Nguyen
Attorney, Agent, or Firm—Hill, Van Santen, Steadman & Simpson

[57] ABSTRACT

An electron beam generator or electron gun has a line-shaped cathode with a flattened tip as an electron source, a slotted diaphragm disposed in the plane of the cathode tip, and a double anode having two electrodes also fashioned as slotted diaphragms. The voltage potentials of the three slotted diaphragms, and their respective distances to the cathode, are selected such that a stigmatic virtual electron source at infinity is obtained.

12 Claims, 4 Drawing Sheets

ELECTRON BEAM GENERATOR

BACKGROUND OF THE INVENTION

1. Field of the Invention

The present invention relates to an electron beam generator or an electron gun suitable for use in a lithography device.

2. Description of the Prior Art

A lithography device (electron beam writer) is described in U.S. Pat. No. 4,724,328 having an electron-optical column including a control diaphragm for generating a plurality of electron probes, which can be individually deflected or blanked. The structural details of the control diaphragm are described in published European application No. 0 191 439. The control diaphragm basically consists of a silicon disc, having a central portion fashioned as a self-supporting membrane, and being provided with a grid of square recesses. An electrode system arranged in the region of the recesses serves as the deflection unit. In order to use the available source current in an optimal fashion, a ribbon-shaped electron beam is made to be incident on the control diaphragm. The electron beam is generated using optics including a cylinder lens and a condenser lens, both lenses being disposed in the path of the electrons between the electron source and the diaphragm. The electron source or emitter may be a LaB$_6$ knife-edged cathode.

It is a problem in the art to provide an electron beam generator for use as described above wherein a ribbon-shaped object, such as a diaphragm with a grid of recesses, can be uniformly irradiated by the electron beam.

SUMMARY OF THE INVENTION

It is an object of the present invention to provide an electron beam generator wherein a ribbon-shaped object can be uniformly irradiated by the electron beam.

The above object is achieved in accordance with the principles of the present invention in an electron beam generator having a line-shaped cathode as the electron source, and an anode for accelerating the electrons emerging from the cathode along the direction of a beam axis, wherein the anode is a slotted diaphragm and wherein two further slotted diaphragms are respectively disposed in sequence between the cathode and the anode. The voltage potentials of the anode and the two further slotted diaphragms, and their respective distances from the cathode, are selected such that a stigmatic virtual electron source at infinity is obtained.

The advantage achievable with the electron beam generator disclosed herein is that the portion of the beam current which is incident, in the plane of the subject, on areas outside the designated area to be illuminated is very small. Furthermore, the stochastic Coulomb-interaction (Boersch effect) in the beam generator can be kept very small.

DESCRIPTION OF THE PREFERRED EMBODIMENTS

Figure 1:
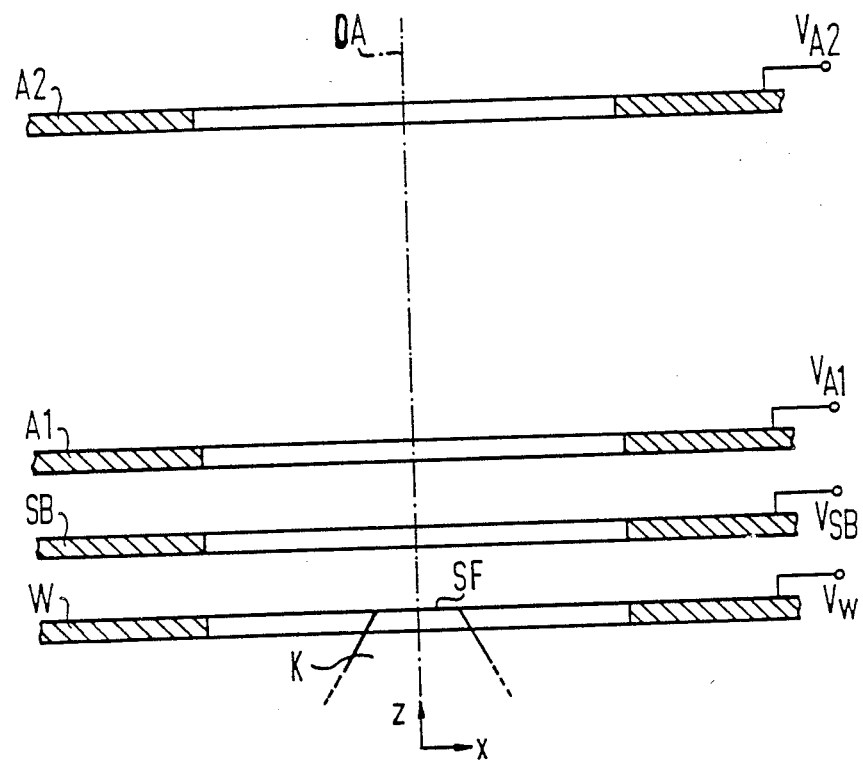
FIG. 1 is a side sectional view of an electron beam generator constructed in accordance with the principles of the present invention.

An electron beam generator constructed in accordance with the principles of the present invention is schematically shown in FIG. 1. This electron beam generator is suitable for use, for example, in the lithography device described in U.S. Pat. No. 4,724,328 for uniform illumination or irradiation of a line-shaped grid of square or rectangular recesses which is present in the control diaphragm. The beam generator includes a line cathode K, which may be a LaB$_6$ knife-edged emitter with a flattened tip. The electron beam generator also includes a slotted diaphragm W disposed in the plane of the cathode tip, and a double anode having electrodes A1 and A2, also fashioned as slotted diaphragms. The electrodes A1 and A2 are each at a respective positive potential $V_{A1}$ and $V_{A2}$. The slotted diaphragm W, which serves for field shaping, is supplied with a negative potential $V_W$ in order to prevent a strong expansion or drift of the electron beam originating from the cathode K. The negative potential also causes the electron emission to be limited basically to the end face SF of the cathode K, which is oriented perpendicularly relative to the beam axis OA.

In order to capture electrons emerging at the border regions of the cathode end face SF, it is preferable to arrange another slotted diaphragm SB between the electrodes W and A1, and to supply the slotted diaphragm SB with a voltage potential $V_{SB}$, with $V_W < V_{SB} < V_{A1}$.

If the slotted diaphragm SB is disposed equidistantly between the electrodes W and A1, the potential $V_{SB}$ should have the value $V_{SB} = \frac{1}{2}(V_{A1} - V_W)$.

Figure 2:
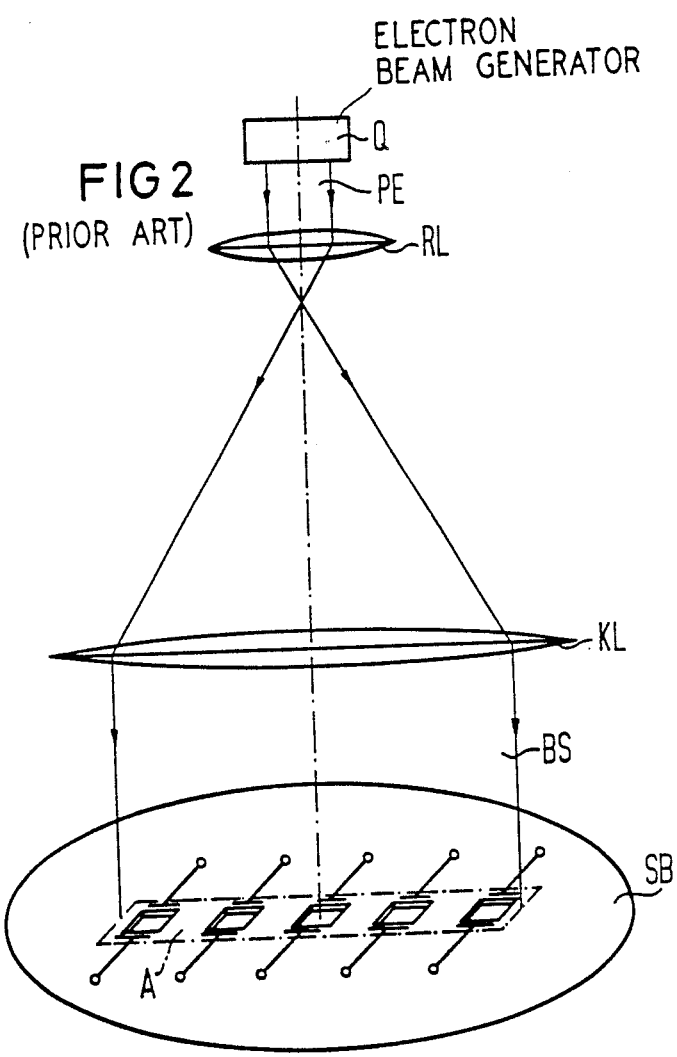
FIG. 2 is a schematic diagram showing the electron optics for illuminating the control diaphragm of a known lithography device.
Figure 3:
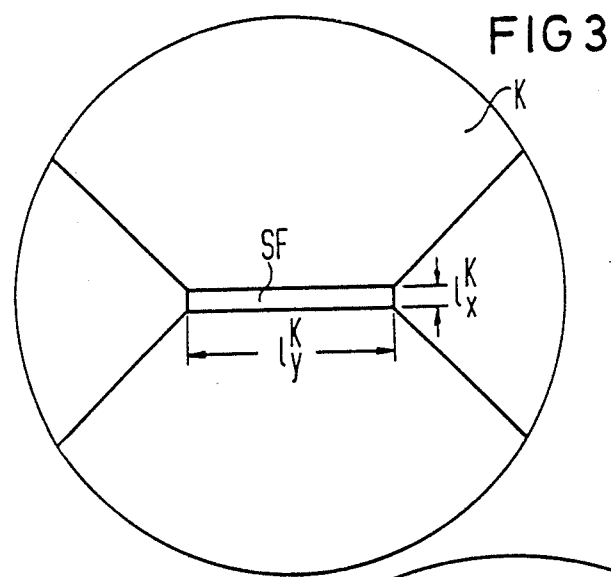
FIG. 3 is a plan view of the cathode of the electron beam generator constructed in accordance with the principles of the present invention.

In order to uniformly illuminate or irradiate an elongated rectangle having an area $A = 20 \times 0.01$ mm$^2$ on the control diaphragm SB with a correspondingly shaped electron beam (ribbon beam) BS, it is necessary to adapt the dimensions of the cathode K to the dimensions of the line-shaped recess structure, as shown in FIGS. 2 and 3. Therefore, the end face SF of the cathode K should have a length $l^K_y \approx 1$ mm and a width $l^K_x < 10$ μm, preferably $l^K_x \approx 0.5$ μm, if the electron optics consisting of a round lens RL and a condenser lens KL, following the electron beam source Q generates an image with a roughly 20× magnification. It is assumed that the cross-section of the electron beam PE leaving the beam generator Q corresponds approximately to the cross-section of the area SF of the emitting cathode K. If this is not the case, a corresponding change in the magnification expansion of the electron optics must be undertaken.

Figure 4:
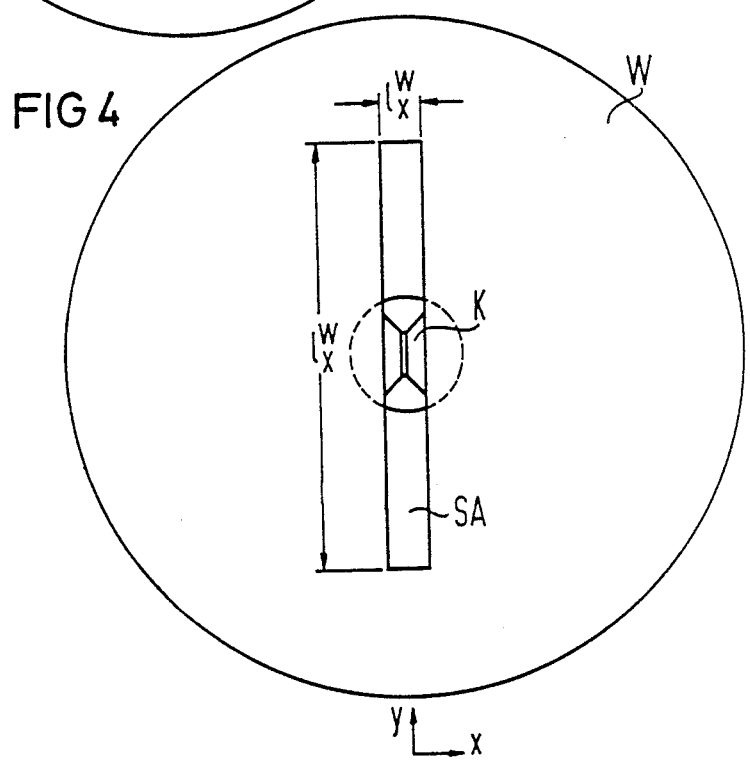
FIG. 4 is plan view of the cathode and the first slotted diaphragm in the electron beam generator constructed in accordance with the principles of the present invention.

The acceleration field inside the beam generator is to be cylindrically symmetric. Such a field distribution is insured with a good approximation if the length-to-width ratio of the slotted diaphragm openings respectively correspond approximately to the length-to-width ratio of the end face of the cathode K. For the diaphragms of the electron beam generator, the relationship therefore should be $l_x^K/l_y^K \approx l_x^i/l_y^i$ wherein i=W, SB, A1, A2, and wherein $l_x^i$ and $l_y^i$ respectively stand for the width measured in the x-direction and the length measured in the y-direction of the slotted recesses SA of the electrodes W, SB, A1 and A2. FIG. 3 shows a plan view of the cathode K flattened at the tip. FIG. 4 shows a plan view of the slotted diaphragm W with the cathode K behind it. In FIGS. 3 and 4, for clarity, a length-to-width ratio of $l_x^K/l_y^K = l_x^W/l_y^W = 1/10$ has been used.

Figure 5:
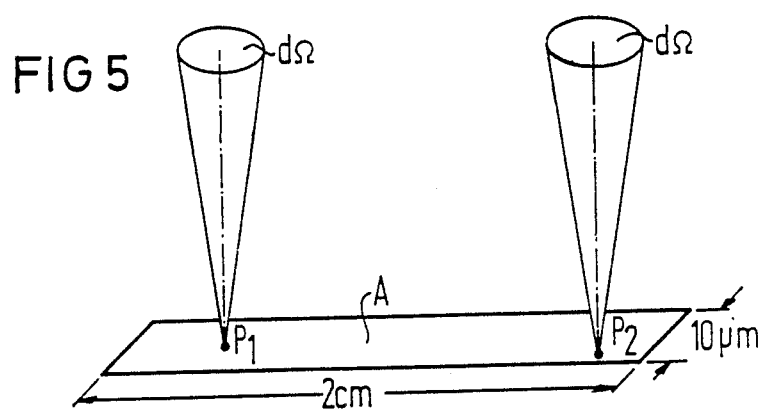
FIG. 5 is a schematic diagram showing the beam characteristic in the plane of the control diaphragm.
Figure 6:
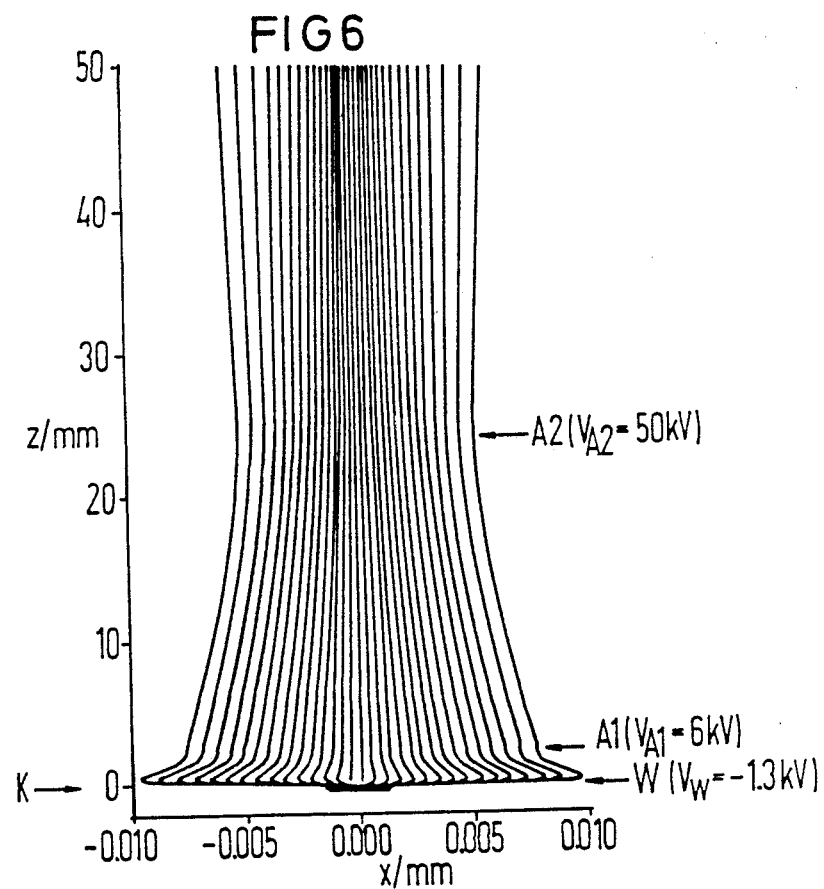
FIG. 6 is a graph showing the electron paths within the beam generator constructed in accordance with the principles of the present invention.

In the known lithography device, an elongated rectangle having an area $A = 20 \times 0.01$ mm$^2$ is to be uniformly illuminated or irradiated with a ribbon-shaped electron beam having an energy $E_{PE} = 50$ keV. As shown in FIG. 5, the electron beams for different points $P_i$ (i=1, 2, ...) of the area A must be parallel to each other (Koehler illumination) and must uniformly fill a round solid angle element $d\Omega$. In order to fulfill these requirements, it must be ensured that the virtual electron source converges in the x-z plane and in the y-z plane. Because the virtual electron source is at infinity in the y-z plane due to the slot geometry $(l_y^i >> l_x^i)$, the acceleration field in the electron beam generator is adjusted so that the electron paths are also proceeding in the x-z plane parallel to the beam axis OA. In this manner, a stigmatic virtual electron source at infinity is obtained.

The individual steps to be followed are (a) The potential $V_{A1}$ of the anode A1 and its distance to the cathode K are to adjusted so that the desired beam current is drawn from the cathode K;

(b) The position of the anode A2 at the prescribed potential $V_{A2}$ of, for example, $V_{A2} = 50$ kV (cathode potential $V_K = 0V$, $E_{PE} = 50$ keV) is adjusted such that an approximately parallel electron beam is obtained; and (c) The potentials $V_W$ and $V_{A1}$ of the negatively charged slotted diaphragm W and the anode A1, as well as their respective distances to each other, are adjusted so that the beam cross-section corresponds approximately to the cross-section of the emitting cathode area SF. A substantially circular beam divergence is achieved.

It should be observed in the step (c) that the desired beam current is achieved.

The results of a model calculation for the electron paths in a beam generator constructed in accordance with the principles of the present invention are shown in FIG. 5. The calculation is based on the assumption that the electrons start at z=0 mm, and at x=0 ... ±0.1 .. . ±1.5 $\mu$m ..., with a speed $V_{PE} = 0$ from the cathode infinitely expanded in the y-direction. The positions of the slotted diaphragms W, A1 and A2 on the beam axis are marked by arrows. The computed potentials $V_W$, $V_{A1}$ and $V_{A2}$ are specified.

Although modifications and changes may be suggested by those skilled in the art it is the intention of the inventors to embody within the patent warranted hereon all changes and modifications as reasonably and properly come within their scope of their contribution to the art.

We claim as our invention:

1. An apparatus for generating a ribbon electron beam comprising:
   a line-shaped cathode as an electron source;
   a first slotted diaphragm anode disposed at a first distance from said cathode and being at a first anode potential for accelerating electrons emerging from said cathode along a beam axis;
   a slotted diaphragm disposed at a second distance from said cathode between said first anode and said cathode and being at a voltage potential;
   a second slotted diaphragm anode disposed at a third distance from said cathode between said first anode and said slotted diaphragm and being at a constant second potential for accelerating electrons along said beam axis; and
   said first, second and third distances and said anode first potential, said voltage potential and said second anode potential being selected to obtain a stigmatic virtual electron source at infinity.

2. An apparatus as claimed in claim 1, wherein said cathode is knife-edged and has a flattened tip.

3. An apparatus as claimed in claim 2, wherein said voltage potential is a negative potential, and wherein said slotted diaphragm is disposed in a plane containing said cathode tip, said plane being disposed perpendicularly relative to said beam axis.

4. An apparatus as claimed in claim 1, wherein each of said second anode potential and said first anode potential are positive potentials, and wherein said second anode potential is lower than said first anode potential.

5. An apparatus as claimed in claim 1, further comprising:
   a further slotted diaphragm disposed between said slotted said diaphragm and second anode and being at a further voltage potential, said further voltage potential being between said voltage potential and said second anode potential.

6. An apparatus as claimed in claim 5, wherein said further slotted diaphragm is disposed equidistantly from said slotted diaphragms diaphragm and said second anode.

7. An apparatus for generating a ribbon electron beam comprising:
   a knife-edged cathode as an electron source, said cathode having a flattened tip;
   a first slotted diaphragm anode disposed at a first distance from said cathode and being at a first anode potential for accelerating electrons emerging from said cathode along a beam axis;
   a slotted diaphragm disposed in a plane containing said cathode tip, said plane being disposed perpendicularly relative to said beam axis, said slotted diaphragm being at a voltage potential;
   a second slotted diaphragm anode disposed at a second distance from said cathode between said slotted diaphragm and said first anode, said second slotted diaphragm anode being at a constant second anode potential for accelerating electrons along said beam axis; and
   said first anode potential being more positive than said second anode potential and said second anode potential being more positive than said voltage potential, and said first anode potential, said voltage potential, said second anode potential, said first distance and said second distance being selected to obtain a stigmatic virtual electron source at infinity.

8. An apparatus as claimed in claim 7, further comprising:
   a further slotted diaphragm disposed between said slotted diaphragm and said first anode, said further slotted diaphragm being at a third distance from said cathode and at a further voltage potential, said further voltage potential being between said voltage potential and said second anode potential, and said first anode potential, said second anode potential, said voltage potential said further voltage potential, said first distance, said second distance and said third distance being selected to obtain a stigmatic virtual electron source at infinity.

9. An apparatus as claimed in claim 8, wherein said third slotted diaphragm is disposed equidistantly between said first and second slotted diaphragms.

10. An apparatus for generating a ribbon electron beam comprising:
- a knife-edged cathode as an electron source, said cathode having a flattened tip;
- a first slotted diaphragm anode disposed at a first distance from said cathode and being at a first anode potential for accelerating electrons emerging from said cathode along a beam axis;
- a first slotted diaphragm disposed in a plane containing said cathode tip, said plane being disposed perpendicularly relative to said beam axis, said first slotted diaphragm being at a first voltage potential;
- a second slotted diaphragm anode disposed at a second distance from said cathode between said first anode and said first slotted diaphragm, said second slotted diaphragm being at a constant second anode potential for accelerating electrons along said beam axis;
- a second slotted diaphragm disposed at a third distance from said cathode between said first slotted diaphragm and said second anode, said second slotted diaphragm being at a second voltage potential; and
- said second voltage potential being more positive than said first voltage potential, said second anode potential being more positive than said second voltage potential, and said first anode potential being more positive than said second anode potential, said first anode potential, said first voltage potential, said second anode potential, said second voltage potential, said first distance, said second distance and said third distance being selected to obtain a stigmatic virtual electron source at infinity.

11. An apparatus as claimed in claim 10, wherein said first voltage potential is a negative potential.

12. An apparatus as claimed in claim 10, wherein said second slotted diaphragm is disposed equidistantly between said first slotted diaphragm and said second anode.

* * * * *